United States Patent [19]
Antia et al.

[11] Patent Number: 5,390,215
[45] Date of Patent: Feb. 14, 1995

[54] MULTI-PROCESSOR DEMODULATOR FOR DIGITAL CELLULAR BASE STATION EMPLOYING PARTITIONED DEMODULATION PROCEDURE WITH PIPELINED EXECUTION

[75] Inventors: Yezdi Antia, Gaithersburg; Youngky Kim, Potomac; Hiep Pham, Gaithersburg, all of Md.

[73] Assignee: Hughes Aircraft Company, Los Angeles, Calif.

[21] Appl. No.: 960,343

[22] Filed: Oct. 13, 1992

[51] Int. Cl.6 .................. H04L 27/06; H04B 7/10
[52] U.S. Cl. ..................... 375/94; 375/100; 371/43
[58] Field of Search .................. 375/39–40, 375/42, 80, 83, 94, 96, 100; 371/43; 379/58–60; 329/304; 455/133, 335, 337, 344–345

[56] References Cited

U.S. PATENT DOCUMENTS

| 4,885,757 | 12/1989 | Provence | 375/96 |
| 5,010,558 | 4/1991 | Yost et al. | 371/43 |
| 5,151,904 | 9/1992 | Reiner et al. | 371/43 |
| 5,272,726 | 12/1993 | Furuya et al. | 375/94 |

OTHER PUBLICATIONS

"A Programmable Parallel Processor Architecture for Viterbi Detection," H. Lou and J. M. Cioffi, 1990 IEEE pp. 1333–1337.

"Soft Decision Viterbi Decoding with Diversity Combining," T. Sakai, K. Kobayashi, S. Kubota, M. Morikura, S. Kato, 1990 IEEE pp. 1127–1131.

"Minimized Method Viterbi Decoding: 600 Mbit/s Per Chip" G. Fettweis, H. Dawid, H. Meyr, 1990 IEEE pp. 1712–1716.

Primary Examiner—Stephen Chin
Assistant Examiner—Young Tse
Attorney, Agent, or Firm—Gordon R. Lindeen, III; Wanda K. Denson-Low

[57] ABSTRACT

Demodulation is provided for a base station receiver in a cellular communication system by a demodulator having four data linked digital signal processors. An MLSE equalizer and maximal ratio combiner for diversity paths includes multiple components that are partitioned among the processors for pipelined execution with predetermined time ordering.

16 Claims, 8 Drawing Sheets

MULTI-PROCESSOR DEMODULATOR FOR DIGITAL CELLULAR BASE STATION EMPLOYING PARTITIONED DEMODULATION PROCEDURE WITH PIPELINED EXECUTION

BACKGROUND OF THE INVENTION

The present invention relates to communication systems and more particularly to cellular communication systems and demodulators that are employed therein.

In analog cellular communication systems, each time frame is restricted to a single channel frequency, i.e. a single mobile user. The user capacity of analog cellular systems is accordingly highly restricted by the number of available frequencies.

Substantially increased cellular system capacity has been achieved with the use of digital technology. In digital systems currently proposed for digital cellular telephony, each time frame is subdivided into 6 time slots, and time division multiple access (TDMA) principles are employed to produce multiple communication channels within each time frame.

In the case of full rate voice coding, two time slots are employed for each channel, and a total of three communication channels are accordingly provided in each time frame. In the case of half rate voice coding, a single time slot is employed for each channel, and a total of six communication channels are accordingly provided in each time frame. Normally, each digital channel is assigned to the same time slots in successive time frames.

The resulting user capacity in TDMA digital systems is thus either three times or six times the user capacity of analog systems depending on the voice coding rate that is employed.

A more recently developed digital system achieves even greater system user capacity through the use of inactive channel time, i.e. voice silence time or digital speech interpolation (DSI), to create additional communication channels within the standard six time slots in each time frame. This improved digital system extends digital system user capacity.

Generally, a DSI system uses voice activity detection to determine active and quiet speech periods. Only speech spurts are transmitted and as a result a mobile unit will have its digital channel assignment (one or more slots within the frame) fixed for speech duration. In a half rate DSI system, each mobile unit may thus be assigned to different time slots in successive transmission time frames according to the actual voice activity from the mobile unit.

In the operation of a digital base station where modulated carrier signals transmitted from mobile units are received. The received signals are downconverted to baseband and convened from analog to digital. A demodulator then extracts information bits from the received signal for subsequent conversion to a voice signal which is coupled to the public telephone system.

The modulated carrier signals include noise, interference, Doppler and multipath and other error signals. In turn, the quality of cellular communications significantly depends on the effectiveness with which the demodulating procedure generates a demodulated signal free of channel induced errors and true to the original modulated signal.

With increased system complexity arising from the application of digital technology to cellular communication systems, a need has developed for more powerful and more sophisticated demodulating procedures that can produce quality or even superior real-time demodulation.

The following previously filed patent applications assigned to the present assignee disclose subject matter related to the present application and are hereby incorporated by reference:

U.S. Pat. No. 5,313,495, entitled "Demodulator for Symbols Transmitted Over a Cellular Channel", filed by Youngky Kim on May 12, 1992.

U.S. Pat. No. 5,319,677, entitled "Diversity Combiner with MLSE for Digital Cellular Radio", filed by Youngky Kim on May 12, 1992.

A significantly improved algorithmic demodulation procedure that functions as a maximum likelihood sequential estimator is disclosed in the above referenced patent applications. That algorithm provides improved demodulation performance with reduced computation requirements relative to the prior art. However, the reduced level of computation requirements still exceeds the computation capability of any currently available digital signal processor.

SUMMARY OF THE INVENTION

The present invention is directed to an efficient, commercially practicable system and method for implementing the referenced demodulating algorithmic procedure or similar relatively complex demodulating algorithmic procedures.

A demodulator is provided for a base station receiver in a cellular communication system, and it comprises means for receiving and filtering transmitted diversity signals and a plurality of digital signal processors for executing in real time a demodulating procedure employing a multi-state maximum likelihood sequence estimator (MLSE) and being executable repeatedly to demodulate successive data groups in each of successive slots in a data frame. The MLSE has multiple calculation components including branch metric, path metric, traceback and channel estimate components that are executed in a predetermined order in each symbol to demodulate data in each data group and that are partitioned among the processors in a predetermined manner. Means are provided for data linking the processors to enable output data from predetermined components to be applied as input data to other predetermined components for time ordered calculations in accordance with the demodulation procedure. At least a first of the processors has at least one of the filtered diversity signals applied as an input thereto and has means for executing a branch metric component to make branch metric calculations therefor. At least an output one of the processors generates a demodulated output for subsequent decoding.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings.

DESCRIPTION OF THE PREFERRED EMBODIMENT

Figure 1:
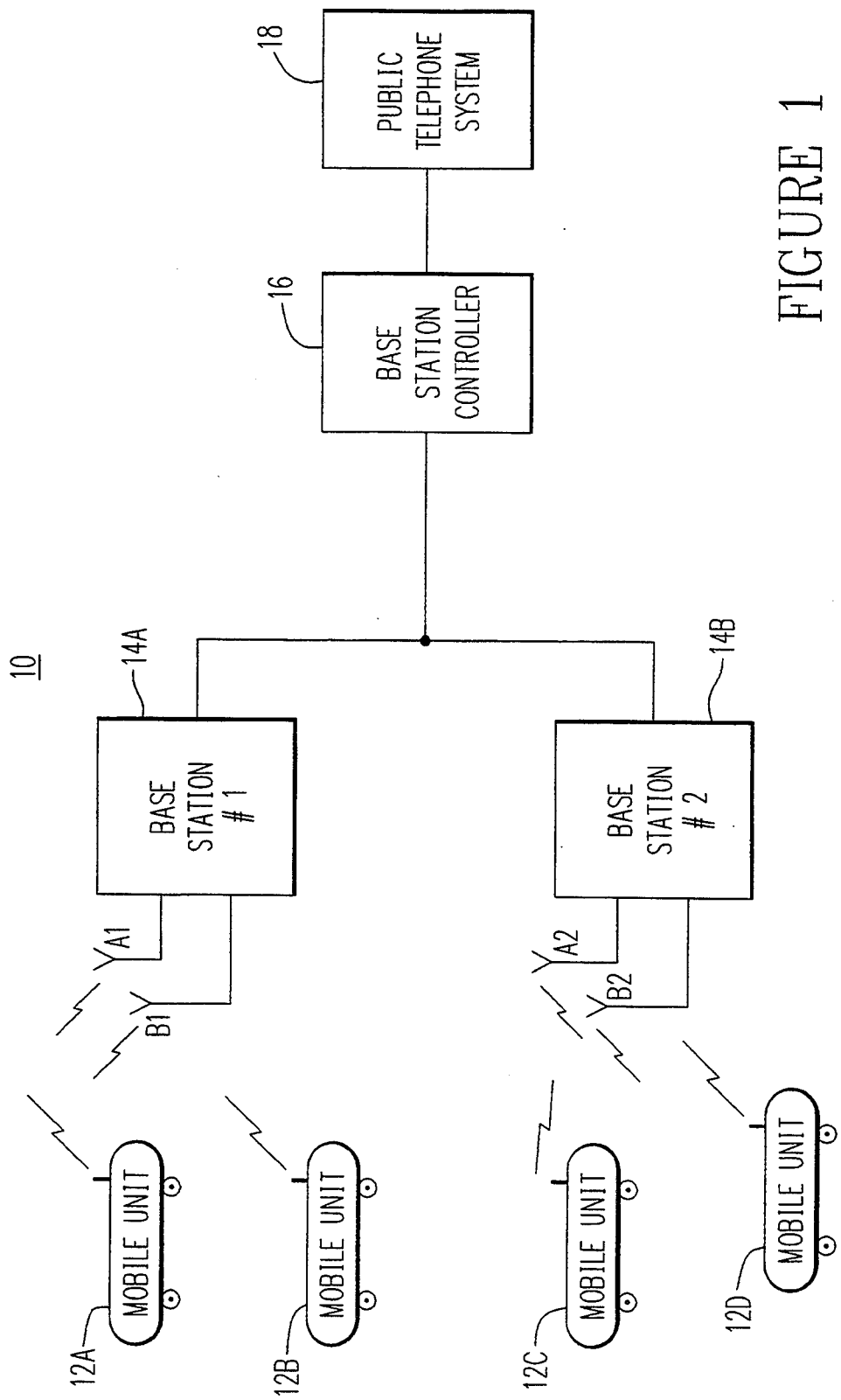
FIG. 1 shows a block diagram for a cellular communication system in which the present invention is embodied in its preferred form.

A cellular communication system 10 is shown in FIG. 1 in which a preferred form of the present invention is embodied. The system 10 is operative in a defined geographic region such as all or part of a metropolitan area.

The cellular system 10 includes numerous mobile phone units, as represented by four illustrated units 12A through 12D. Communication links may be established between the mobile units 12A–12D and a base station for the communication cell within which the mobile unit(s) may be located. In this illustrative case two base stations 14A and 14B are shown.

Respective pairs of diversity antennae A1, B1 and A2, B2 are provided at the base stations to provide for receiving diversity signals from a transmitting mobile unit. In the preferred embodiment, the diversity signals are processed to remove errors and develop high quality demodulated voice signals in accordance with the invention.

A base station controller 16 provides system management functions through regulation of the operation of the base stations 14A and 14B and by establishing communication links with a public telephone system 18.

Figure 2:
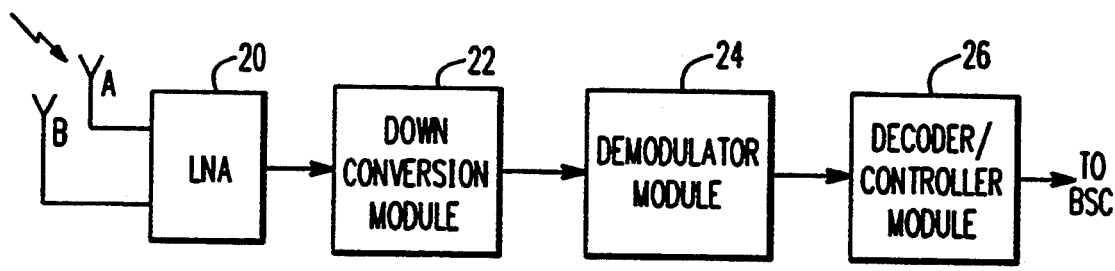
FIG. 2 presents a subsystem block diagram for base station circuitry included in the system of FIG. 1.

As shown in FIG. 2, circuitry for the base station 14A or 14B includes an RF receiver having a low noise amplifier 20 that receives signals from diversity antennae A and B. Next, a down-conversion module 22 provides signal downconversion from RF to the baseband and then provides analog-to-digital conversion through a signal sampling procedure.

The output digital signal from the downconversion module 22 is applied to a demodulator means or a demodulator module 24 where the originally modulated signal is demodulated. The originally transmitted signal is modulated using $\pi/4$, shifted differential encoded quadrature phase shift keying.

The demodulator means 24 is structured in accordance with the present invention to provide improved demodulation in the sense that superior, relatively complex demodulation algorithms are enabled to be implemented cost effectively in real time with state-of-the-art processor hardware. As a result, cellular base station products can be manufactured and supplied to the market at competitive prices and simultaneously provide superior demodulation performance, higher quality voice channels, and extended system communication coverage and user capacity.

The demodulator means 24 can be employed in digital cellular communication systems, such as the previously noted TDMA systems. The half rate DSI TDMA system effectively increases system capacity through the use of voice activity detection in managing the use of transmission time in the frame slots.

The output of the demodulator 24 is coupled to a decoder/controller module 26 where bit errors are detected and forward error correction is applied to the demodulated signal. A decoded and corrected signal is generated and sent for voice processing in the base station controller 16. The decoder/controller module 26 also provides high level control and system management for the base station circuitry.

As previously indicated, the voice signal (having originated from a particular, connected mobile unit) is linked to the public telephone system 18 for connection to any other phone or mobile unit. Return voice signals from the connected phone are processed by base station transmission circuitry (not shown) for transmission to the originally connected mobile unit.

DIGITAL SIGNAL STRUCTURE FOR TIME DIVISION MULTIPLEX SYSTEM

Figure 9A:
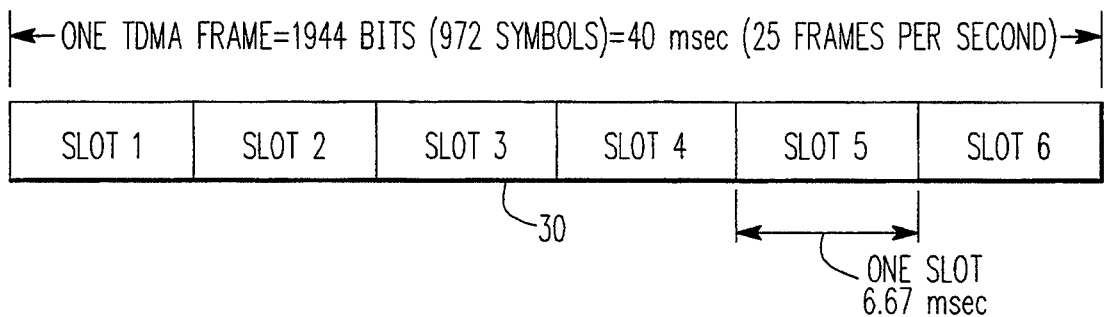
FIG. 9A shows a schematic for the structure of a TDMA time frame.

As shown in FIG. 9A, each digital frame 30 in a digital signal, for a TDMA system employable in the preferred embodiment, has a duration of 40 milliseconds and contains six slots each of which has a duration of 6.67 milliseconds. A total of 1944 bits or 972 symbols are provided in the frame 30.

The following abbreviations are used for data field codes: G=guard time; R=ramp time; Data=User Information; CDVCC=Coded Digital Verification Color Code; SYNC=Synchronization and Training.

Each symbol represents a phasor signal and accordingly contains a pair of bits that define the x and y values of the phasor signal.

Figure 9B:
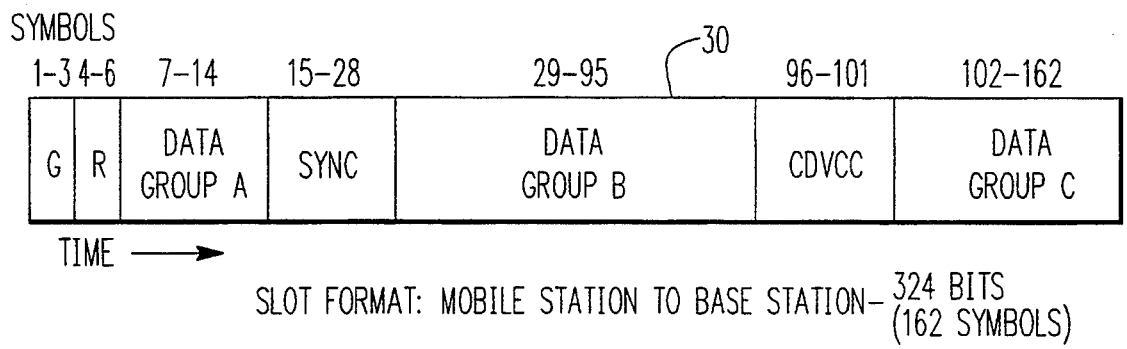
FIG. 9B illustrates a data field format employed in each slot for mobile station-to-base station communications.

Data is formatted into the digital frame 30 as shown in FIG. 9B. Data fields are sequentially disposed along the timeline of the frame 30 as shown with the symbols contained in the data fields designated above.

For example, the first data field contains the first three symbols numbered 1 to 3 which serve to provide guard time as indicated in the listed data field codes. User information is contained in the data field which has 67 symbols numbered 29 to 95.

DEMODULATOR CIRCUITRY

In FIGS. 4–8, the following abbreviations are used: BM1=Branch Metric for Antenna A; BM2=Branch Metric for Antenna B; PM=Path Metric; TB=Trace Back; HD=Hard Decision of Symbol; CE1=Channel Estimation for Antenna A; CE2=Channel Estimation for Antenna B; SD=Soft Decision with Channel State Information.

Figure 3:
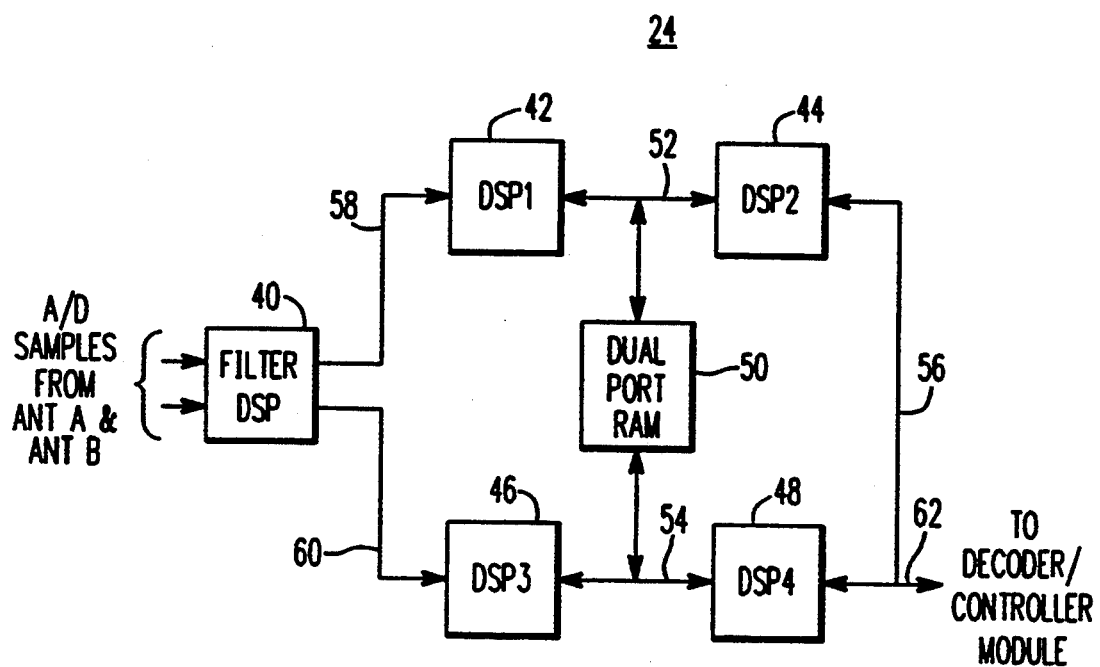
FIG. 3 shows a block diagram for the preferred embodiment of demodulator circuitry included in the base station circuitry of FIG. 2 and employing a multiprocessor hardware architecture with interprocessor communication links in accordance with the present invention.

The demodulator means 24 of this preferred embodiment is shown with some greater detail in FIG. 3. Diversity signals originating from the two antennae are eventually converted from analog form to digital form by a signal sampling procedure. Samples are preferably generated at four times the symbol rate to provide four samples per symbol.

The resultant diversity sample signals are applied to the input of the filter processor 40 where matched filtering is applied to the signal values.

Preferably, a plurality of current state-of-the-art digital signal processors (DSPs) are employed collectively to provide the high volume, complex, coordinated data processing needed for improved signal demodulation in accordance with the invention. A total of four DSPs 42, 44, 46, and 48 are employed, and they may, for example, be Motorola 96002 processors. In other applications of the invention, other DSP hardware arrangements may be employed according to the needs of the particular application and according to the state of the art at the time of invention application.

The DSPs 42-48 are preferably coupled through a shared dual port RAM memory 50. The DSPs 42-48 are also chained together over data bus links 52, 54, and 56. As a result, each DSP can be directly linked to each other DSP via a data bus link or the dual port RAM 50.

The filter DSP 40 generates respective matched filtered output signals for the antennae A and B that are transferred respectively over data links 58 and 60 as inputs to the DSPs 42 and 46. Generally, the DSPs 42-48 are cooperatively programmed with partitioned functionality and with pipe lined execution procedures that result in real time demodulation leading to the economic and product performance advantages that are characteristic to the present invention. Demodulated output signals are generated on an output bus 62 for decoding by the module 26 as described in connection with FIG. 2.

ALGORITHMIC DEMODULATION PROCEDURE

Figure 4:
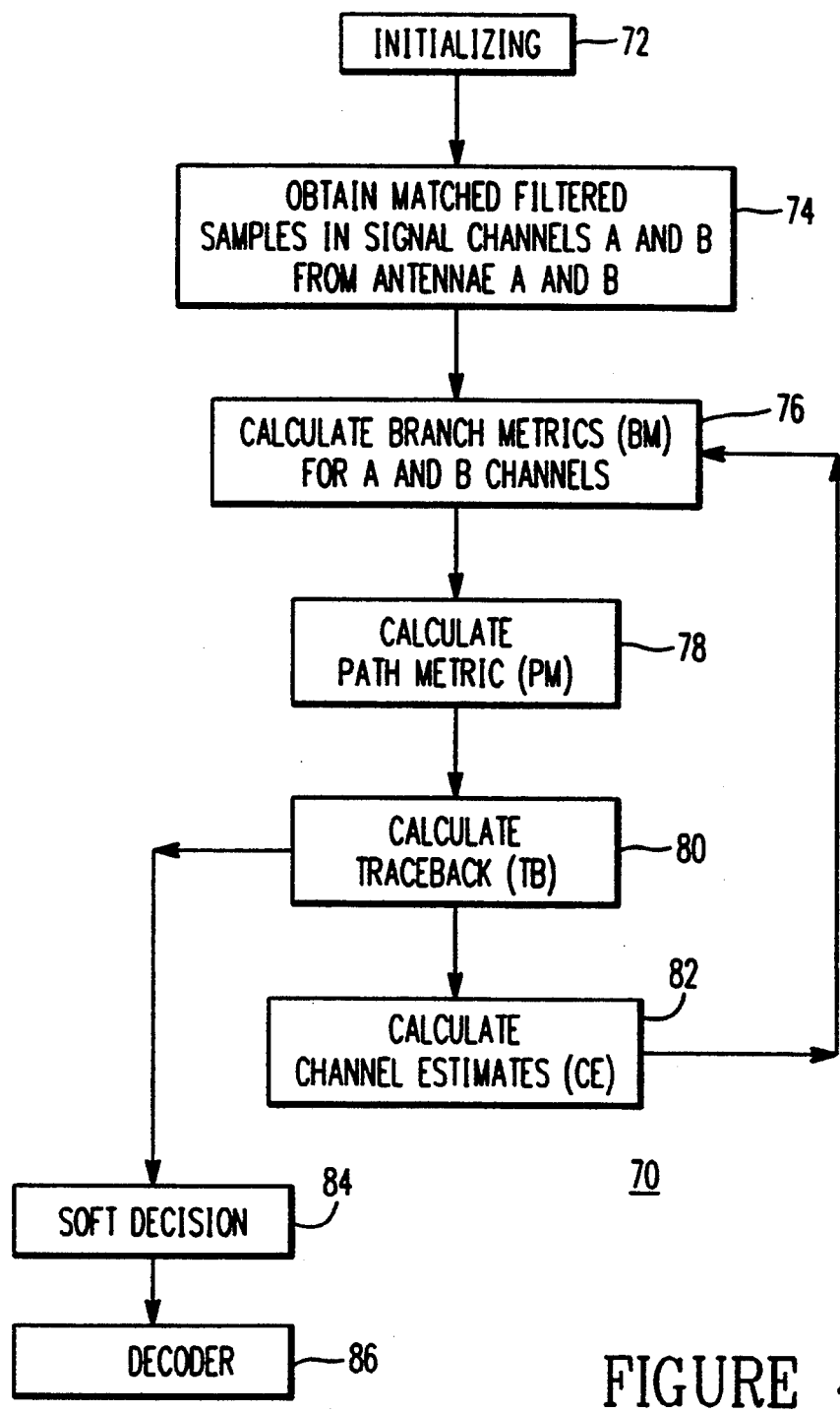
FIG. 4 shows a flow chart representing the basic functions performed by a demodulation procedure employed by the demodulator of FIG. 3 in the preferred embodiment of the invention.

In FIG. 4, there is shown an overview flow chart that illustrates a basic algorithmic demodulation procedure 70 that is preferably executed by the demodulator means 24. The procedure 70 preferably embodies a maximum likelihood sequence estimator (MLSE) based on a multi-state Viterbi trellis algorithm, and further preferably specifically embodies an MLSE in the form of a four-state Viterbi algorithm disclosed in the referenced copending applications.

In operating as an MLSE, the preferred four-state Viterbi algorithm requires significantly less computing power than previous conventional MLSE modules such as sixteen state Viterbi algorithms. However, as previously indicated, the preferred four-state Viterbi algorithm still requires computing power in excess of that provided by state-of-the-art DSP devices. The present invention generally makes it possible to implement multi-state (i.e. 4-state, 16 state, 64 state and higher) MLSE or Viterbi algorithms with state-of-the-art DSP hardware, and specifically to implement at commercially competitive costs the preferred four-state Viterbi algorithm with currently available DSP hardware.

The demodulation procedure 70 is a general representation of the procedural steps executed by the DSPs 42-48 taken together. The procedure 70 is repeatedly executed for successively received symbol groups that contain data to be demodulated. Within the procedure 70, iterative calculations are made for successive symbols within the current symbol group.

Channel estimate values are initialized in a block 72, and, in each symbol, a block 74 obtains the current set of matched filtered sample values for the diversity signals received by the antennae A and B.

Next, the branch metrics (BM) are calculated as a measure of likelihood for all branches in the Viterbi trellis for antennae A and B in a block 76. The BM calculation is basically a weighting of possible transitions from each state in one symbol period to other states in the next symbol period. This step employs as inputs the matched filter sample values and channel estimate values for the current symbol, and calculates all possible branch metrics in the 4-state trellis. Accordingly, the step 76 imposes a very substantial processing load on the demodulator means 24.

A path metric (PM) is then calculated from the two branch metric outputs in a block 78, and a traceback (TB)is performed by a block 80 to determine from the PM output the best of the four possible states. The PM calculation is basically a weighting at each node of the last PM and the current branch metric for each possible path in the trellis. The best path metric is the lowest one.

The traceback procedure is preferably performed with a depth of two symbols because of fading channel considerations. A hard decision bit is defined by a traceback of two symbols over the best path metric.

The steps 76, 78, and 80 as a group constitute a 4-state Viterbi equalizer. In performing the described calculations, the equalizer compensates for multipath distortion.

After traceback, matched filtered samples for the tracebacked symbol time period and hard decision bits, calculated by the TB step 80 in the current symbol time period, are applied to a block 82 for calculation of new channel estimate values. The channel estimate values provide estimates of the channel parameters which enable channel behavior to be predicted and, more specifically, enable compensation to be provided for variations caused by changes in channel behavior resulting from changes in channel physical conditions. Channel impairments including those resulting from frequency and phase distortions are compensated by calculated values of distortion parameters.

The new channel estimate values are fed back from the block 82 to the block 76 for use in compensating for channel behavior variations in the branch metric calculations in the next iteration of the Viterbi trellis calculation within the demodulation procedure 70.

The traceback output from the block 80 is additionally applied, along with the path metric output from the block 78, as inputs to a soft decision (SD) block 84. Generally, the SD block 84 generates scaled values, within a predetermined value range, from the hard 0 and 1 bits generated by the traceback block 80. Generally, the soft decision procedure scales each hard bit in accordance with a determined confidence factor applicable thereto.

The demodulation procedure 70 has an output block 84 that sends the soft decision outputs to the decoder module 26 as successive data symbols are processed. After each data group is processed, the demodulation procedure 70 is ended and waits for its next execution until the next data group begins to be received.

PARTITIONING

Execution of the demodulation procedure 70 with state-of-the-art processor hardware is made possible, thereby providing performance and economic improvements as previously described, through the employment of multiple digital signal processors preferably with a combined implementation of partitioning of procedure functions and pipelining of the execution of steps in the procedure 70. With efficient execution of the procedure 70 in the DSPs 42-48 in the preferred embodiment, required total processing power is reduced.

The use of multiple DSPs with partitioned and, preferably pipelined, execution of procedure functions provides the total processing power needed for real time execution of the demodulation procedure 70. No single state-of-the-art processor chip has the level of processing power needed for this purpose.

Partitioning of functions is preferably implemented to balance the processing load among the multiple DSPs and to limit the volume and frequency of data transfers. By limiting data transfer frequency, pipelining of the execution of procedure steps is facilitated.

Figure 5:
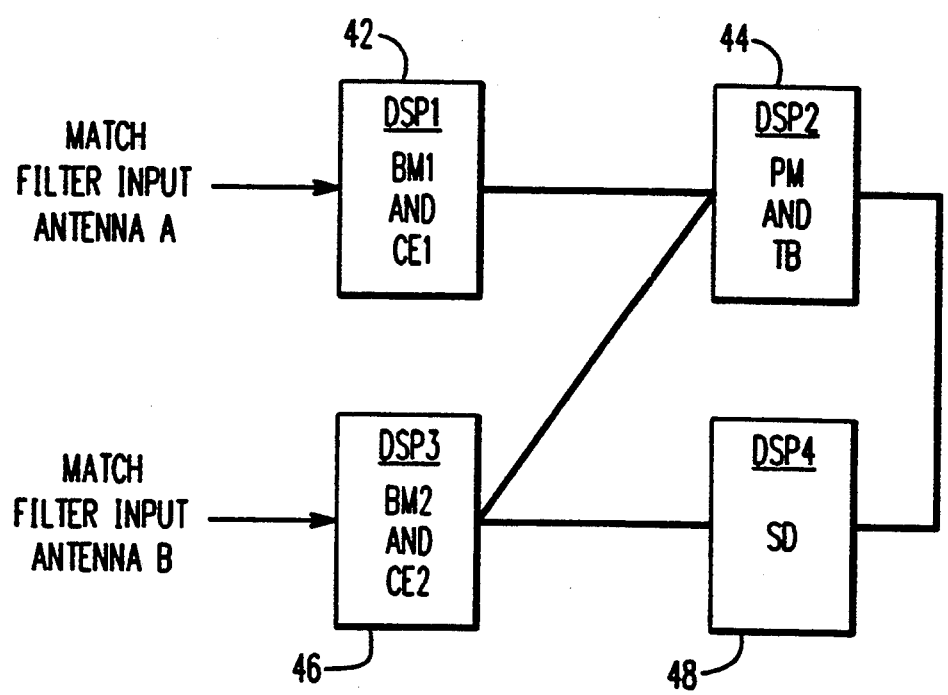
FIG. 5 shows the preferred partitioning of a demodulation procedure for execution among the multiple processors of the demodulator shown in FIG. 2.

The following table, and the diagram shown in FIG. 5, provide the preferred partitioning in the present embodiment:

| DSP1 | DSP2 | DSP3 | DSP4 |
|------|------|------|------|
| BM-A | PM   | BM-B | SD   |
| CE-A | TB   | CE-B |      |

The input sample signals A and B are applied respectively to the DSP1 42 and the DSP3 46 where they are used in the respective BM calculations. The PM and TB procedures are both performed in the DSP2 44. The SD calculations are performed in the DSP4 48 enabling the output values to be applied directly to the decoder over the bus 62.

PIPELINING

To provide efficient, real-time execution of the demodulation procedure 70 and to contribute to the realization of the use of state-of-the-art processor hardware to meet processing power requirements of the demodulation procedure 70, the execution of steps in the procedure 70 is preferably pipelined. Since the buildup of a Viterbi trellis is different for a startup state, a steady state, and a final state, some pipelining differences are employed for the three states.

The real-time demodulation procedure 70 is run for each of the three data groups or fields in each frame slot. Accordingly, the procedure is executed a total of 18 times in each TDMA frame (FIGS. 9A and 9B). On each run, the demodulation procedure 70 goes through the startup, steady and final states. Further, during each run, calculation steps are iteratively performed over successive time ticks, i.e. over successive symbols.

The pipelining system distributes the various calculation tasks for each symbol over successive symbol time periods and does so in a logical manner that enables calculation results to be available when needed for real-time execution and simultaneously provide balanced and effective use of the processing power of the multiple DSPs. The pipelining execution of the demodulation procedure 70 is illustrated by bar graphs in FIGS. 6-8 where startup, steady-state, and final phases 90, 92, and 94 of the demodulation procedure 70 are respectively shown.

In the bar graphs, time extends in the horizontal direction and is divided by vertical lines into successive symbol periods which are marked by processor interrupts. Four rows are provided in correspondence to the processors DSP1, DSP2, DSP3, and DSP4. In each row, bars are variously labeled and extend over varying times to show when the partitioned tasks are performed in relation to each other in the four DSPs.

The principal differentiating characteristic of the startup phase is that the initial state is known at the start time so that branch metrics need only be calculated from the known state to each of the four states in the next symbol. In the final phase, the principal differentiating characteristic is that a tail trace back is made from a known state.

The startup phase 90 begins with a symbol (n−2), and the branch metric output values resulting from the next preceding symbol (n−3) are initialized for the two diversity channels in the processors DSP1 and DSP3 as indicated by task-time bars 96 and 98.

Within the remaining time in the symbol (n−2), the branch metrics BM1 and BM2 are calculated by the processors DSP1 and DSP3 for the current symbol (n−2) as indicated by task-time bars 100 and 102. In the same remaining time period, the path metric PM is calculated by the processor DSP2 for the symbol (n−3) as indicated by a task-time bar 104.

In the next symbol (n−1), the branch metric calculations BM1 and BM2 are calculated for the current symbol (n−1) in the processors DSP1 and DSP3 as indicated by task-time bars 106 and 108. Additionally, the path metric PM for the symbol (n−2) is calculated by the processor DSP2.

In the final symbol (n) of the startup phase 90, branch metrics are calculated by the processors DSP1 and DSP3 for the current symbol (n) as indicated by bars 112 and 114. The processor DSP2 calculates the path metric for the symbol (n−1), then computes a traceback TB for the symbol (n−1) and registers the hard decision bits HD resulting from the traceback calculation as indicated by successive task-time bars 116, 118, and 120.

With the (n−1) traceback output available, channel estimate calculations CE1 and CE2 are performed for the symbol (n−1) by the processors DSP1 and DSP3 in the remaining (n) symbol time as indicated by bars 122 and 124. Channel estimate parameters used in the next symbol (n+1) are appropriately predicted from the channel estimate parameters calculated for the symbol (n−1) during the symbol (n).

Figure 7:
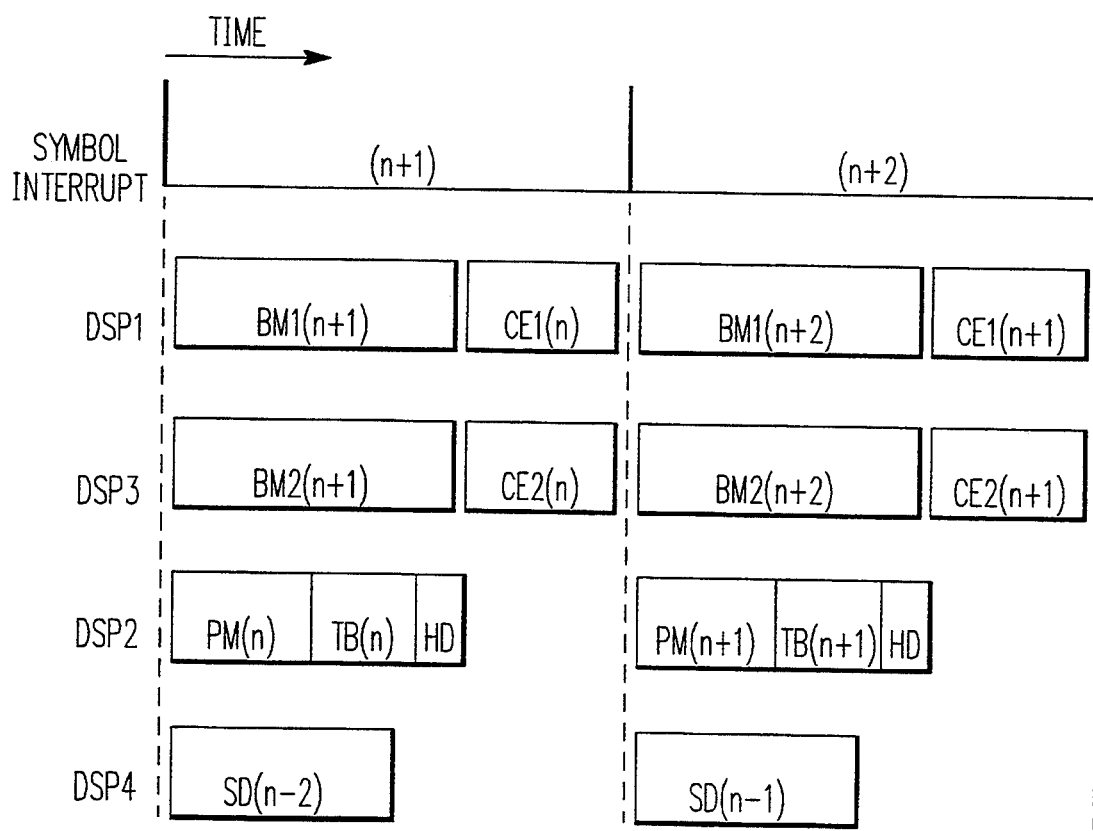

The startup phase 90 of the demodulation procedure 70 ends with the symbol (n). In the steady-state phase 92, multiple symbols occur but only two symbols (n+1) and (n+2) are represented in FIG. 7 to illustrate the steady-state partitioning and pipelining of the demodulation procedure 70.

Time-task bars for the processors DSP1, DSP2, and DSP3 during the symbols (n+1) and (n+2) follow the pattern described for the symbol (n). In addition, in the symbol (n+1), soft decision calculations SD are made from the hard bits for the symbol (n−2) by the processor DSP4 and output values are generated for decoding as previously described. Similarly, in the symbol (n+2), soft decision calculations are performed by the processor DSP4 for the symbol (n−1).

In the final phase 94 of the demodulation procedure 70, branch metric calculations are made in symbol (n+3) for the symbol (n+3) as indicated by bars 126 and 128. In addition, path metric and traceback calculations are made in the symbol (n+3) by the processor DSP2 for the symbols (n+2) and (n+3) as indicated, respectively, by bars 130 and 132 and bars 134 and 136. The final traceback calculation is a tail calculation which means that the remaining bits are traced back from a known state.

The processor DSP4 makes the soft decision calculations for both symbols (n−1) and (n) as indicated by bars 138 and 140. In the final symbol (n+4) the processor DSP4 makes the soft decision calculations for the symbols (n+1), (n+2), and (n+3). Since the processors DSP1, DSP2, and DSP3 are otherwise idle in the symbol (n+4), and since the processor DSP4 will be idle in the first symbol of the startup phase of the next execution of the demodulation procedure 70, it is preferred that the calculations be pipelined such that the final phase of the ending execution be overlapped with the startup phase of the next execution. In other words, tasks to be performed in the first symbol in the next startup phase, in correspondence to the bars 96-104 in FIG. 6, would be performed by the processors DSP1, DSP2, and DSP3 in the symbol (n+4).

Figure 6:
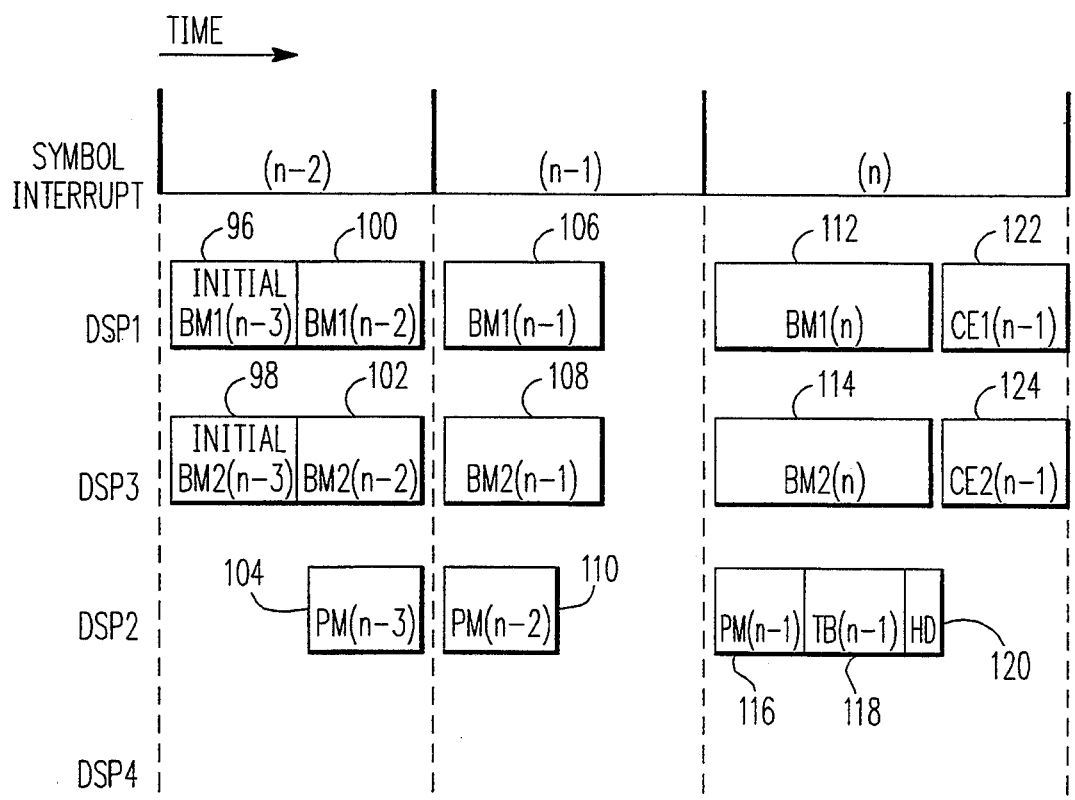
FIGS. 6–8 schematically represent pipelining employed by the demodulator respectively during a startup state, a steady state, and a final state in every symbol period.
Figure 8:
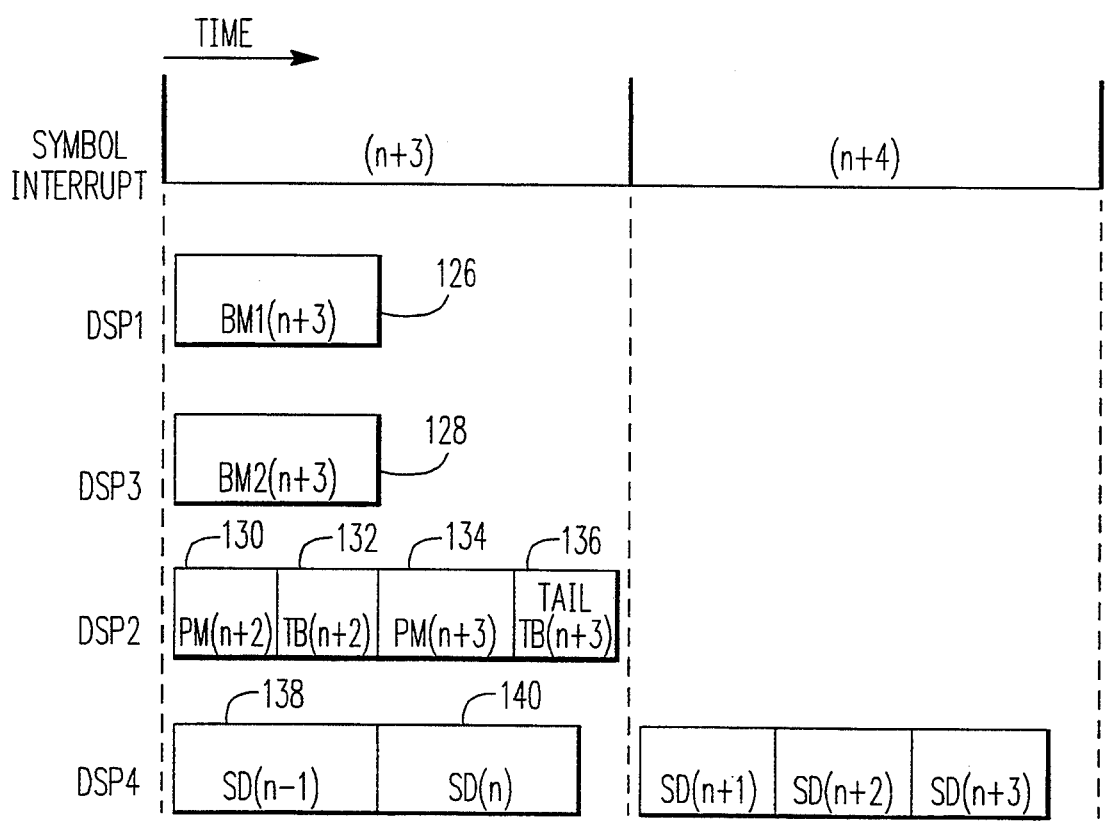

As demonstrated by the graphs shown in FIGS. 6-8, the demodulation procedural steps are executed with proper time ordering in real time and with reasonably balanced computational loading for the DSPs. Improved demodulation performance and improved base station operation are provided by the invention as a result of the capability provided for implementing advanced demodulation algorithms cost effectively with state-of-the-art digital signal processors.

The foregoing description of the preferred embodiment has been presented to illustrate the invention. It is not intended to be exhaustive or to limit the invention to the form disclosed.

In applying the invention, modifications and variations can be made by those skilled in the pertaining art without departing from the scope and spirit of the invention. It is intended that the scope of the invention be defined by the claims appended hereto, and their equivalents.

What is claimed is:

1. A demodulator for a base station receiver in a cellular communication system, said demodulator comprising:

means for receiving and filtering transmitted diversity signals;

a plurality of digital signal processors for executing in real time a demodulating procedure employing a multi-state maximum likelihood sequence estimator (MLSE) Process and being executable repeatedly to demodulate successive data groups in each of successive slots in a data frame;

said MLSE Process having multiple calculation components including branch metric, path metric, traceback and channel estimate components that are executed in a predetermined order in each symbol to demodulate data in each data group and that are partitioned among said processors in a predetermined manner;

means for data linking said processors to enable output data from predetermined components to be applied as input data to other predetermined components for time ordered calculations in accordance with the demodulation procedure;

at least a first of said processors having at least one of the filtered diversity signals applied as an input thereto and having means for executing a branch metric component to make branch metric calculations therefor; and at least an output one of said processors generating a demodulated output for subsequent decoding.

2. The demodulator of claim I wherein said data linking means directly links each of said processors to each other processor.

3. The demodulator of claim 1 wherein the MLSE Process is a multi-state Viterbi trellis algorithm.

4. The demodulator of claim 3 wherein:

a total of four processors are provided including said first and said output processors;

a third of said four processors has the other filtered diversity signal applied thereto as an input and has means for executing a branch metric component to make branch metric calculations therefor, the branch metric calculations for said diversity signals being performed by said first and third processors substantially simultaneously during each of successive symbols in each data group execution of the demodulation procedure.

5. The demodulator of claim 4 wherein a second of said four processors has means for executing a path metric component to make path metric calculations on branch metric outputs from said first and third processors.

6. The demodulator of claim 5 wherein the branch metric calculations generated in each symbol are pipelined from said first and second processors to said third processor for a path metric calculation for that symbol during the next symbol.

7. The demodulator of claim 5 wherein:

said first and third processors each has means for executing a channel estimate component in each symbol after execution of the associated branch metric component;

said second processor further has means for executing a traceback component to make traceback calculations on output values from said path metric component; and a fourth of said processors is said output processor and has means for executing a soft decision component to make soft decision calculations and generates said demodulated output from hard decision bits generated by said traceback component in said second processor.

8. The demodulator of claim 6 wherein the traceback hard decision bits and the path metric calculated in said second processor in each symbol are pipelined to said fourth processor as inputs to said soft decision component for soft decision calculations in the third subsequent symbol.

9. The demodulator of claim 4 wherein said data linking means directly links each of said processors to each other processor.

10. The demodulator of claim 1 wherein all of said components are executed in each symbol with the outputs from one or more predetermined components in each symbol in at least one of said processors being pipelined for input to at least one other predetermined component in a subsequent symbol in another of said processors.

11. A demodulating method for a base station receiver in a cellular communication system, the steps of said method comprising:

receiving and filtering transmitted diversity signals;

using a plurality of digital signal processors to execute in real time a demodulating procedure employing a multi-state maximum likelihood sequence estimator (MLSE) Process and being executable repeatedly to demodulate successive data groups in each of successive slots in a data frame;

executing multiple calculation components in the MLSE Process including branch metric, path metric, traceback and channel estimate components in a predetermined order in each symbol to demodulate data in each data group and with predetermined partitioning among the processors;

linking the processors to enable output data from predetermined components to be applied as input data to other predetermined components for time ordered calculations in accordance with the demodulation procedure;

applying at least one of the filtered diversity signals as an input to at least a first of the processors and executing a branch metric component in the first processor to make branch metric calculations for the one signal; and operating at least an output one of said processors to generate a demodulated output for subsequent decoding.

12. The method of claim 11 wherein the MLSE Process is a multi-state Viterbi trellis algorithm.

13. The method of claim 11 wherein the MLSE Process is a multi-state Viterbi trellis algorithm and a total of four processors are provided including the first and output processors, and wherein the steps further comprise:

applying the other filtered diversity signal to a third of said four processors as an input and operating the third processor to execute a branch metric component to make branch metric calculations for the other signal, the branch metric calculation steps for the diversity signals being performed by the first and third processors substantially simultaneously during each of successive symbols in each data group execution of the demodulation procedure;

operating a second of the four processors to execute a path metric component to make path metric calculations on branch metric outputs from the first and third processors;

operating the first and third processors to execute a channel estimate component in each symbol after execution of the associated branch metric component;

operating the second processor to execute a traceback component to make traceback calculations on output values from the path metric component; and operating a fourth of the processors as the output processor to execute a soft decision component to make soft decision calculations and generate the demodulated output from hard bits generated by the traceback component in the second processor.

14. A base station receiver for a cellular communication system comprising:

respective antenna means for receiving diversity signals from mobile transmitters;

means for downconverting the diversity signals;

means for demodulating the downconverted signals; and said demodulation means having: means for receiving and filtering transmitted diversity signals;

a plurality of digital signal processors for executing in real time a demodulating procedure employing a multi-state maximum likelihood sequence estimator (MLSE) Process and being executable repeatedly to demodulate successive data groups in each of successive slots in a data frame;

said MLSE Process having multiple calculation components including branch metric, path metric, traceback and channel estimate components that are executed in a predetermined order in each symbol to demodulate data in each data group and that are partitioned among said processors in a predetermined manner;

means for data linking said processors to enable output data from predetermined components to be applied as input data to other predetermined components for time ordered calculations in accordance with the demodulation procedure;

at least a first of said processors having at least one of the filtered diversity signals applied as an input thereto and having means for executing a branch metric component to make branch metric calculations therefor;

at least an output one of said processors generating a demodulated output for subsequent decoding;

means for decoding the output signals from said demodulating means; and means for voice processing the decoded signals for coupling to a public telephone network.

15. The base station receiver of claim 14 wherein the MLSE Process is a multi-state Viterbi trellis algorithm.

16. The base station receiver of claim 14 wherein:

a total of four processors are provided including said first and said output processors;

a third of said four processors has the other filtered diversity signal applied thereto as an input and has means for executing a branch metric component to make branch metric calculations therefor, the branch metric calculations for said diversity signals being performed by said first and third processors substantially simultaneously during each of successive symbol in each data group execution of the demodulation procedure;

a second of said four processors has means for executing a path metric component to make path metric calculations on branch metric outputs from said first and third processors;

said first and third processors each have means for executing a channel estimate component in each symbol after execution of the associated branch metric component;

said second processor further has means for executing a traceback component to make traceback calculations on output values from said path metric component; and a fourth of said processors is said output processor and has means for executing a soft decision component to make soft decision calculations and generate said demodulated output from hard bits generated by said traceback component in said second processor.

* * * * *